United States Patent [19]

Katzenstein

[11] Patent Number: 4,928,102

[45] Date of Patent: May 22, 1990

[54] FLASH ANALOG-TO-DIGITAL CONVERTER WITH LOGARITHMIC/LINEAR THRESHOLD VOLTAGES

[75] Inventor: Henry S. Katzenstein, Pacific Palisades, Calif.

[73] Assignee: Brooktree Corporation, San Diego, Calif.

[21] Appl. No.: 231,100

[22] Filed: Aug. 11, 1988

[51] Int. Cl.$^5$ ............... H03M 1/36; H03M 1/78; H01C 10/04

[52] U.S. Cl. ............... 341/154; 341/159; 341/138; 338/89; 338/90; 338/308; 338/325; 338/330

[58] Field of Search ............... 341/138, 153, 154, 155, 341/158, 159; 338/89, 90, 92, 94, 125, 126, 128, 130, 133, 185, 308, 309, 323, 324, 325, 327, 328, 330

[56] References Cited

U.S. PATENT DOCUMENTS

| | | | |
|---|---|---|---|
| 3,260,889 | 7/1966 | Blank | 341/138 |
| 3,336,558 | 8/1967 | Wright | 338/90 |
| 3,564,475 | 2/1971 | Fujii et al. | 338/89 |
| 3,653,033 | 3/1972 | Bonami et al. | 341/138 |
| 3,723,938 | 3/1973 | Gramm | 338/92 |
| 4,146,882 | 3/1979 | Hoff, Jr. et al. | 341/118 |
| 4,232,302 | 11/1980 | Jagatich | 341/138 |
| 4,447,747 | 5/1984 | LaPotin | 338/323 |
| 4,521,764 | 6/1985 | Burton | 341/154 |
| 4,625,197 | 11/1986 | Holmes | 341/138 |
| 4,682,099 | 7/1987 | Koken | 338/89 |
| 4,703,302 | 10/1987 | Hino et al. | 338/260 |
| 4,794,374 | 12/1988 | Koike | 341/155 |

Primary Examiner—William M. Shoop, Jr.
Assistant Examiner—H. L. Williams
Attorney, Agent, or Firm—Ellsworth R. Roston; Charles H. Schwartz

[57] ABSTRACT

A plurality of equally spaced terminals may be disposed at a side edge of a substantially uniformly resistive thin film. A reference potential (e.g. ground) may be applied to the second side of the film. An energizing voltage may be applied at the juncture between the first side edge and a particular one of the top and bottom edges of the film. In this way, the successive terminals receive voltages with a logarithmic relationship relative to the terminal positions. When a linear relationship of voltages is desired at successive terminals in a low range, no reference potential is applied to the second side edge of the thin film. Instead, the other one of the top and bottom edges may receive the reference voltage. Alternatively no reference voltage may be applied and terminals indicating the linear voltages may be disposed at such other edge. Each of a plurality of comparators providing an output indicative of the input voltage receives an input voltage and the voltage at an individual one of the successive terminals. The voltages in the logarithmic portion of the thin film may be calibrated by a circuit including a capacitance to indicate voltage deviations from the logarithmic relationship. The successive terminal voltages in the linear portion of the film may be calibrated by the capacitance circuit and a constant current source to indicate voltage deviations from the linear relationship.

35 Claims, 4 Drawing Sheets

FLASH ANALOG-TO-DIGITAL CONVERTER WITH LOGARITHMIC/LINEAR THRESHOLD VOLTAGES

This invention relates to analog-to-digital converters and more particularly relates to analog-to-digital converters providing a logarithmic output. More particularly, the invention relates to analog-to-digital converters providing a logarithmic output over a first voltage range and providing a linear output over a second voltage range. The invention further relates to systems for calibrating such converters.

Data processing systems operate on digital signals. However, the inputs to the data processing systems are generally analog. For example, parameters such as temperatures and pressures may be continuously measured in a system for manufacturing chemicals. These measurements have to be converted to a digital form before they can be introduced to the data processing system for processing by such system. Analog-to-digital converters have been in use for a considerable number of years to convert analog signals into a digital form.

There are two (2) important parameters in considering the performance of analog-to-digital converters. These are (1) the speed of the conversion and (2) the resolution or accuracy with which the analog data is converted to a digital form. The converters now in use have been successful in accomplishing only one (1) of these two (2) parameters.

In one type of converter, a plurality of comparators are employed to operate on a simultaneous —or parallel —basis. In order to provide an accuracy in the conversion, a large number of comparators have to be used. For example, when a conversion has to be made to twelve (12) binary bits, four thousand and ninety five (4095) converters have to be used. As will be appreciated, this causes the converter to be large, complex, expensive and difficult to produce.

In another type of converter, successive approximations are made to convert the analog value to the corresponding digital value. In each approximation, the value of progressive bits of reduced binary significance is determined. This type of converter is relatively simple and can be quite accurate, particularly if the number of successive approximations is relatively large. However, this type of converter is slow. Furthermore, the time required to obtain a conversion increases as the accuracy of the conversion is increased.

One possible solution to the problems discussed above in analog-to-digital converters is to use a converter which has a logarithmic characteristic. In this type of converter, the resolution is made inversely proportional to the signal level. This results in a constant fractional resolution over the range of conversion. For most applications such as digitizing video information, this is satisfactory.

A critical requirement for an analog-to-digital converter having logarithmic characteristics is to have, for the comparator reference levels, a voltage which exponentially decays as a function of successive tap positions. In order to do this, problems have arisen in the prior art. For example, when a single resistive path is provided with taps disposed at exponentially spaced intervals, an impractically long resistive path results. Furthermore, at low voltage levels, the taps become so closely spaced that they cannot be separated from one another as a practical matter.

The desirability of providing an analog-to-digital converter with logarithmic characteristics has been known for some time. Because of this, a considerable effort has been made, and substantial amounts of money have been expended, to provide such a converter. In spite of such efforts and such considerable expenditures of money, the difficulties in providing a satisfactory analog-to-digital converter with logarithmic characteristics still remain.

This invention provides an analog-to-digital converter which has logarithmic characteristics and which overcomes the difficulties discussed above. The converter of this invention is fast, simple and inexpensive. It provides a resistive path which is relatively short and has equally spaced taps (or terminals) which provide voltages with an analog relationship. Furthermore, the converter may be constructed to provide a linear relationship at low voltages so as to provide a useable response in the vicinity of zero voltage input.

In one embodiment of the invention, a member has a thin film on its surface with substantially uniform electrically resistive characteristics. A plurality of terminals are disposed on the thin film at one side edge of the thin film. A reference potential such as an electrical ground is applied to the second side edge of the thin film. An energizing voltage is applied to the thin film at the juncture between the first side edge and a particular one of the top and bottom edges of the thin film. In this way, voltages are produced at the successive terminals with a logarithmic relationship to the position of the terminals.

When a linear relationship is desired between the voltages at the successive terminals in the low voltage range, the relationship between the position of the terminals and the reference potential electrode is altered. In one such embodiment, the reference potential is not applied to the second side edge of the thin film at the positions in the vertical direction corresponding to such terminal. Instead, the reference voltage may be applied to the other one of the top and bottom edges. In another such embodiment, a row of terminals may be located across the width of the strip near its bottom edge.

A plurality of comparators are provided each connected to receive an input voltage and the voltage at an individual one of the successive terminals. The comparators provide an output indicative of the input voltage.

The voltages on the successive terminals in the first portion of the thin film may be calibrated by a circuit including a capacitance to indicate deviations from the logarithmic relationship. The voltages on the successive terminals in the second portion of the thin film may be calibrated by the capacitance circuit and a souce of substantially constant current to indicate deviations from the linear relationship.

In the drawings:

FIG. 4b is another embodiment for the same relationship as discussed above with respect to FIG. 4a;

Figure 1:
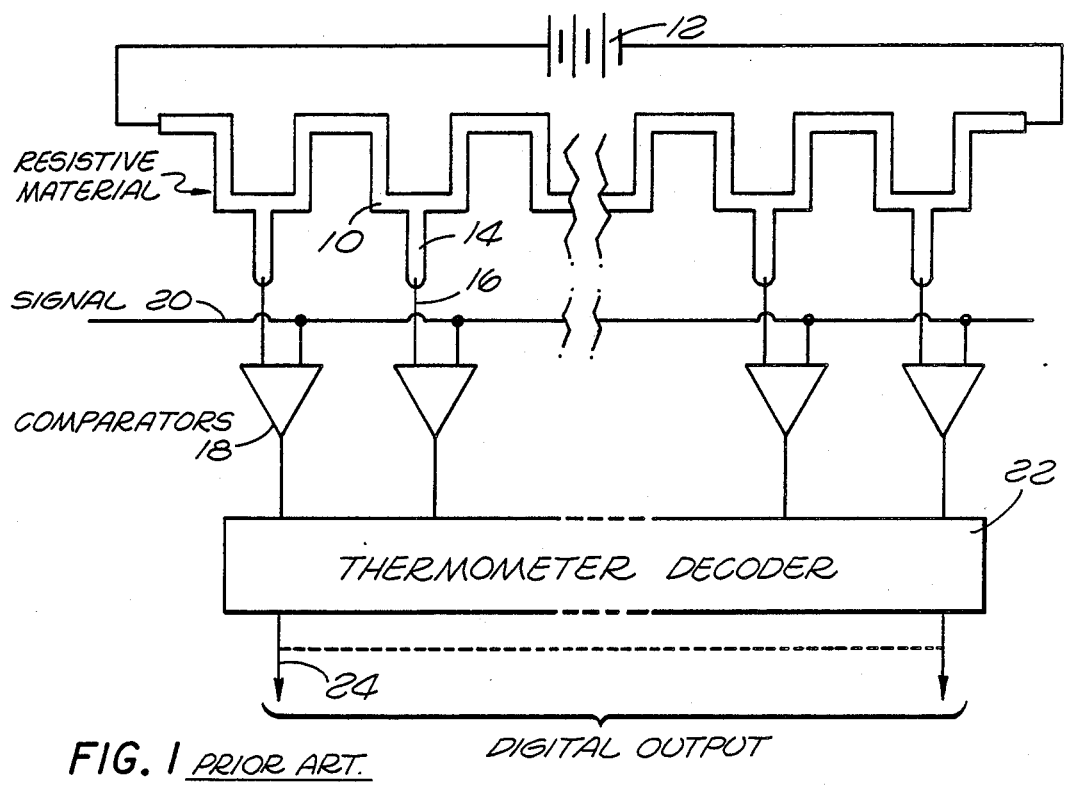
FIG. 1 is a schematic diagram of apparatus in the prior art for converting an analog voltage in a linear relationship to a corresponding digital output.

FIG. 1 illustrates one embodiment of the prior art for converting an analog voltage into a digital output at a plurality of terminals where the outputs at the successive terminals in the plurality have a linear relationship to one another. In the prior art embodiment shown in FIG. 1, a resistive element 10, such as an element made from a thin film of electrically conductive material, is connected at its opposite ends to a source of direct voltage such as a battery 12. As will be seen, the path of the resistive element 10 may be undulating to increase the length of the path within a confined space.

A plurality of terminals 14 are provided at equally spaced intervals along the resistive element 10. Leads 16 extend from the terminals 14 to first input terminals of comparators 18 which may be constructed in a conventional manner. A signal is applied through a line 20 to second input terminals of the comparators 18. The output signals from the comparators 18 are applied to a decoder 22 which may be constructed in a conventional manner. Output leads 24 extend from the decoder 22.

Since the terminals 14 are equally spaced along the length of the resistive element 10, the magnitudes of the voltages produced at the successive terminals 14 have a linear relationship to one another. The voltages on the terminals 14 are introduced to the comparators 18 for comparison with the signal on the line 20. The results of this comparison are indicated in a well known manner by the decoder 22. For example, when the voltage introduced to one of the comparators 18 from the associated terminal 14 is greater than the signal on the line 20, the comparator produces a positive output signal.

The comparator 18 produces a negative output signal when the voltage introduced to the comparator 18 from the associated terminal 14 is less than the input signal. The decoder 22 determines the position along the resistive element 10 where the voltage from one of two adjacent comparators is positive and the voltage from the other one of the two adjacent comparators is negative. The decoder then converts the voltage at this position along the resistive element 10 to a corresponding digital value at the output terminals 24.

The converter discussed above has certain significant disadvantages. In order to provide a conversion to a desired accuracy, a considerable number of terminals 14 have to be provided at spaced intervals along the resistive element 10. For example, to provide a resolution of twelve (12) binary bits, four thousand and ninety five (4095) terminals 14 and a corresponding number of comparators 18 have to be provided. As will be appreciated, this is difficult to accomplish in a limited space even with the most advanced techniques of producing integrated circuitry.

As a result, either the number of terminals 14 and comparators 18 have to be reduced with a corresponding reduction in resolution or the size of the resistive element 10 has to be increased. Increasing the size of the resistive element 10 is contrary to the concerted attempts in the industry for years to reduce the size of electrical circuitry such as on integrated circuit chips or to pack circuitry with increased density on an integrated circuit chip of a given size.

Figure 2:
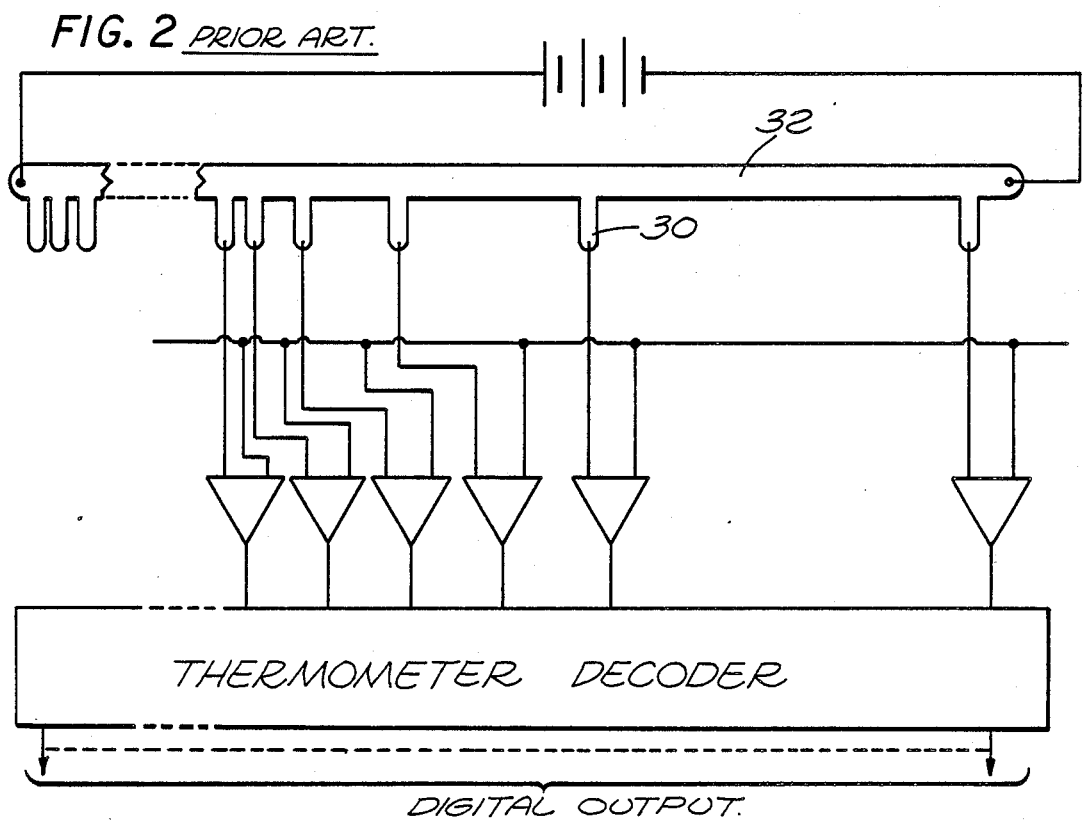
FIG. 2 is a schematic diagram of apparatus in the prior art for converting an analog voltage in a logarithmic relationship to a corresponding digital output.

FIG. 2 shows an analog-to-digital converter similar to that shown in FIG. 1. The converter shown in FIG. 2 is also well known in the prior art. However, the terminals 30 in FIG. 2 are not equally spaced along a resistive element 32 as in the embodiment shown in FIG. 1. Rather, the terminals 30 have a logarithmic spacing relative to one another along the resistive element 32. This causes the successive terminals 32 to provide voltages having a logarithmic relationship to one another.

As will be seen in FIG. 2, the spacing between the successive terminals 30 progressively decreases as the voltages on the terminals decreases. Thus, the terminals 30 become so closely spaced that it becomes difficult to separate them at low votages. This limits the number of terminals that can be provided on the resistive element 32 and accordingly limits the resolution provided by the converter shown in FIG. 2.

Figure 3:
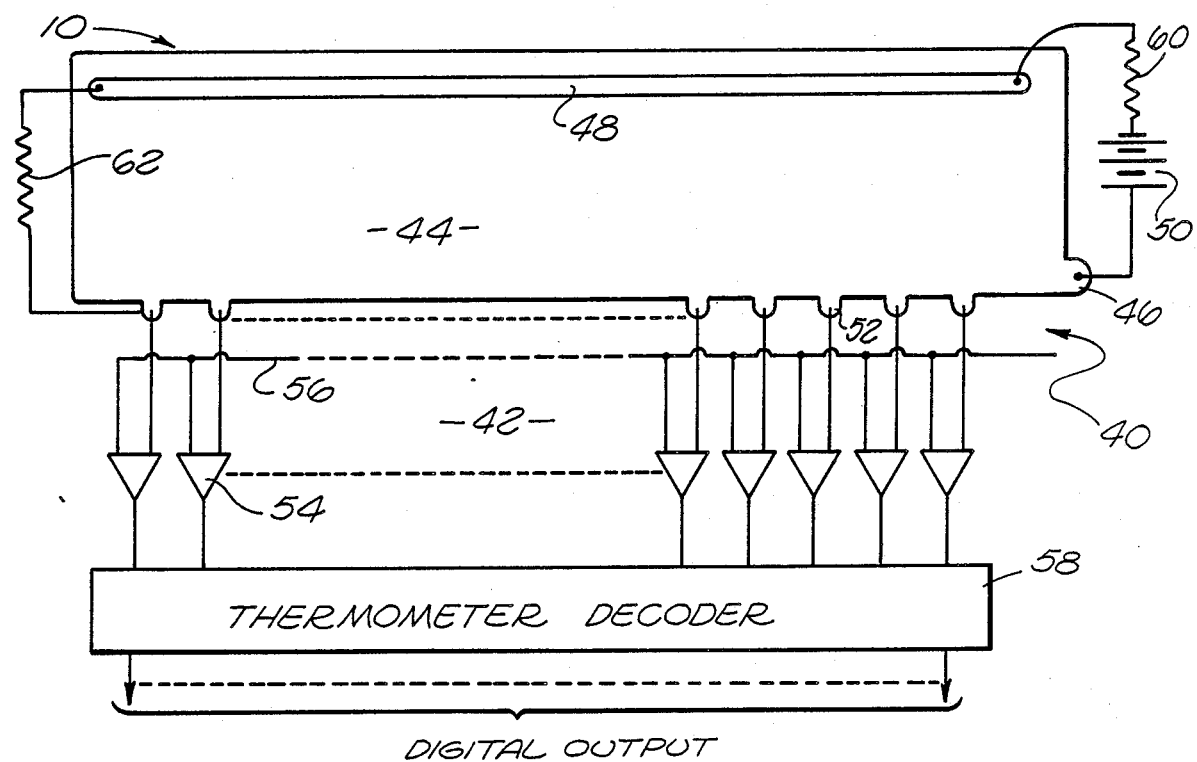
FIG. 3 is a schematic diagram of apparatus constituting one embodiment of this invention for converting an analog voltage in a logarithmic relationship to a corresponding digital output.

FIG. 3 illustrates one embodiment of an analog-to-digital converter, generally indicated at 40, constituting this invention. In this embodiment, a member 42 made from a suitable electrically insulating material is provided. A thin film 44 made from a suitable electrically resistive material is disposed on one surface of the member 42. Preferably the thin film 44 is rectangular in configuration and is provided with a substantially uniform electrical resistivity per unit area at the different positions on the film. The thin film 44 may be formed in a conventional manner as by diffusion, ion implantation of impurities into a semi-conducting substrate or vapor deposition of metal or semi-conductors on the member 42. The vapor deposition may be provided by evaporation, sputtering or chemical vapor deposition.

An ear 46 may be provided on the member 42 at the juncture between the top edge and the right side edge of the member and the thin film 44 may disposed on this ear. A highly conductive strip 48 is disposed on the thin film 44 along the left edge of the thin film 44. A direct voltage such as from a battery 50 is applied between the thin film 44 at the position of the ear 46 and the conductive strip 48. Terminals 52 are disposed at equally spaced intervals along the right edge of the thin film. The terminals 52 are connected to first input terminals of comparators 54. Second input terminals of the comparators 54 receive an input voltage on a line 56. The outputs from the comparators 54 are applied to a decoder 58. The comparators 54, the line 56 and the decoder 58 may respectively correspond to the comparator 18, the line 20 and the decoder 22 in FIG. 1.

Figure 8:
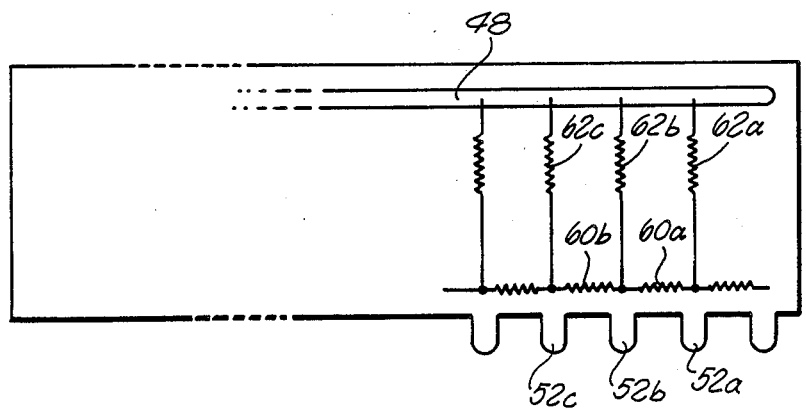
FIG. 8 is a schematic diagram showing apparatus including the converter shown in FIG. 3 for indicating in digital form the magnitude of an unknown input voltage.

Although the terminals 52 are equally spaced along the right edge of the thin film 44, the magnitudes of the voltages produced at the successive terminals have a logarithmic relationship to one another with respect to the positions of such terminals. This may be seen from FIG. 8 where the effective series resistances between successive terminals 52a, 52b and 52c are respectively indicated at 60a and 60b and the effective shunt resistances between the conductive strip 48 and the terminals 52a, 52b and 52c are respectively indicated at 62a, 62b and 62c.

As will be seen, the effective series resistances 60a and 60b between the terminals 52a and 52b and the terminals 52b and 52c have equal values and the resistances 62a, 62b and 62c also have equal values (different from the values of the resistances 60a and 60b). As a result, the ratio between the effective value of the resistance 62b and the sum of the values of the effective resistances 62b and 60a is the same as the ratio between the value of the effective resistance 62c and the sum of the values of the effective resistances 62c and 60b. This may be expressed mathematically as:

$$\frac{62b}{62b + 60a} = \frac{62c}{62c + 60b}$$

The constant ratio shown in the above equation establishes that the voltages on the terminals 52 have a logarithmic relationship with respect to the positions of the terminals even though the terminals 52 are equally spaced. In other words, the voltage distribution along the right side of the thin film 44 with respect to the positions of the terminals conforms substantially to the function $V = V_0 (e - ax)$ where "a" is an attenuation factor related to the aspect ratio (the ratio of the width to the height of the thin film 44), x is the distance along the lower edge of the thin film from the ear 46 $V_0$ is the voltage applied to the ear 46 in FIG. 3 and V is the voltage at individual ones of the terminals 52 in FIG. 3. The logarithmic relationship may be seen by differentiating this equation to obtain $\log V = \log V_0 - ax$.

In one embodiment of the invention, the thin film 44 may constitute a rectangle of doped polysilicon film having a length-to-width ratio of approximately five to one (5:1). The resistivity may be in the order of one hundred (100) ohms per square. The voltage from the source 50 may be in the order of four (4) volts. Two hundred and thirty five (235) terminals 52 may be disposed at equally spaced positions along the right side edge of the thin film 44. The ratio between the voltages at successive terminals 52 will then be 1.03:1. The voltage ratio between the top one and the bottom one of the terminals 52 in FIG. 3 will be approximately two thousand to one (2000:1).

It should be noted that the logarithmic characteristic of the converter shown in FIG. 3 and discussed above is not affected by a gradual variation in the resistivity of the thin film 44. Such a gradual variation may result from gradients induced in the thin film 44 during the process of forming the thin film on the supporting member. The logarithmic characterisitic is unaffected by this gradual variation because the ratio of resistivities as discussed above remains substantially constant with such gradual variations in the resistivity of the thin film 44. Thus, the ratio of resistivities as discussed above will be affected only by higher order effects. In contrast, the linearity of a converter with linear characteristics is directly affected by gradual variations in the resistivity of the thin film 44. For the same reasons as discussed above, the logarithmic characteristic of the thin film 44 is not affected by changes in the temperature of the thin film 44.

If desired, a resistance 60 may be disposed electrically between the positive terminal of the battery 50 and the ear 46, and a resistance 62 may be disposed electrically between the lowermost of the terminals 52 and the terminal 48. These voltages are included to provide effective terminations for the resistance ladder defined by the thin film 44, the conductor 48 and the terminals 52. In this way, any fringe effects in the converter shown in FIG. 3 are minimized.

In some cases, it may be useful to make the distribution of voltages along the terminals 52 linear for some areas of the thin film 44 rather than exponential. In particular, it may be desirable to make the distribution of the low voltages linear rather than exponential. This may be desirable for low voltages since the logarithm of zero (0) is not defined. Furthermore, a logarithmic relationship between the spacing of the terminals 52 at the low end of the voltage range may be undesirable because of the close spacing between voltage levels, needlessly increasingly the number of comparators.

Figure 4A:
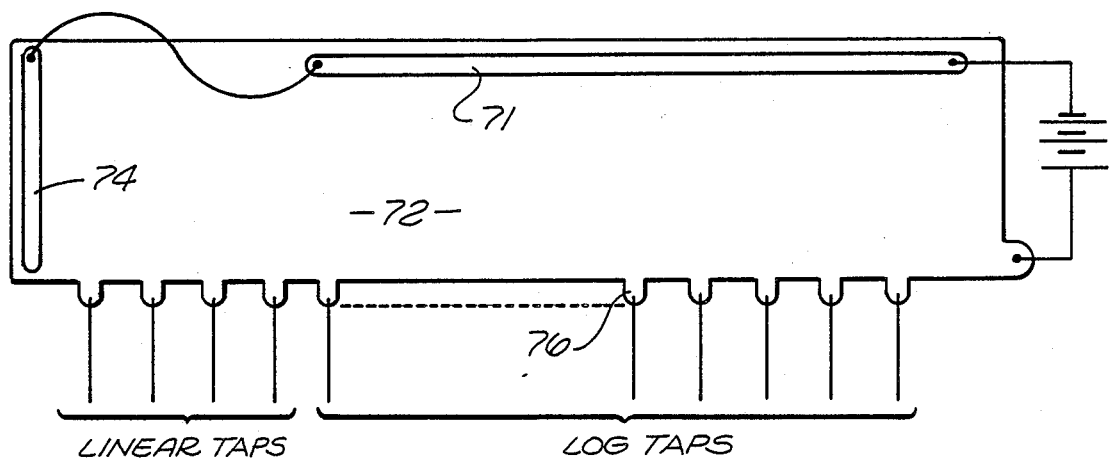
FIG. 4a is a schematic diagram of apparatus constituting one embodiment of this invention for converting an analog voltage to a corresponding digital voltage in a logarithmic relationship for high analog values and in a linear relationship for low analog values.

The embodiment shown in FIG. 4 provides a logarithmic relationship between the voltage at, and the position of, terminals 70 at the high end of the voltage range and a linear relationship between the voltage at, and the position of, terminals at the low end of the voltage range. In the embodiment shown in FIG. 4a, a highly conductive strip 71 (corresponding to the conductive strip 48 in FIG. 3) is provided along a portion of the distance between the top and bottom of a thin film 72. The distance of the conductive strip 70 corresponds to the distance in which the thin film 72 acts to provide a logarithmic conversion. In addition, a conductive strip 74 may be disposed on the thin film 72 at the bottom edge of the thin film.

Figure 6:
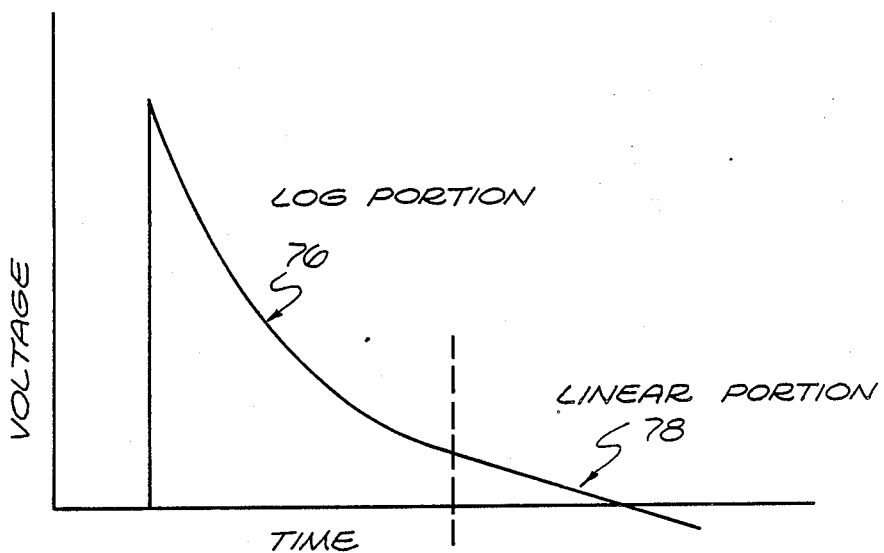
FIG. 6 is a curve showing the magnitude of the analog voltage produced at different positions in a member included in the converter shown in FIG. 4.

As will be seen in FIG. 6, voltages having a logarithmic relationship with respect to the positions of the successive terminals 70 are produced at such successive terminals on the portion of the thin film 72 corresponding to the positioning of the conductive strip 71. This is indicated at 76 in FIG. 6. In the portion of the thin film 72 below the conductive strip 70, a voltage having a linear relationship with respect to successive terminals is produced at such successive terminals of the thin film. This results from the disposition of the conductive strip 74 on the thin film at the bottom edge of the thin film in FIG. 4. The linear relationship of the voltage at successive terminals at the low end of the voltage ranges is indicated at 78 in FIG. 6.

Figure 4B:
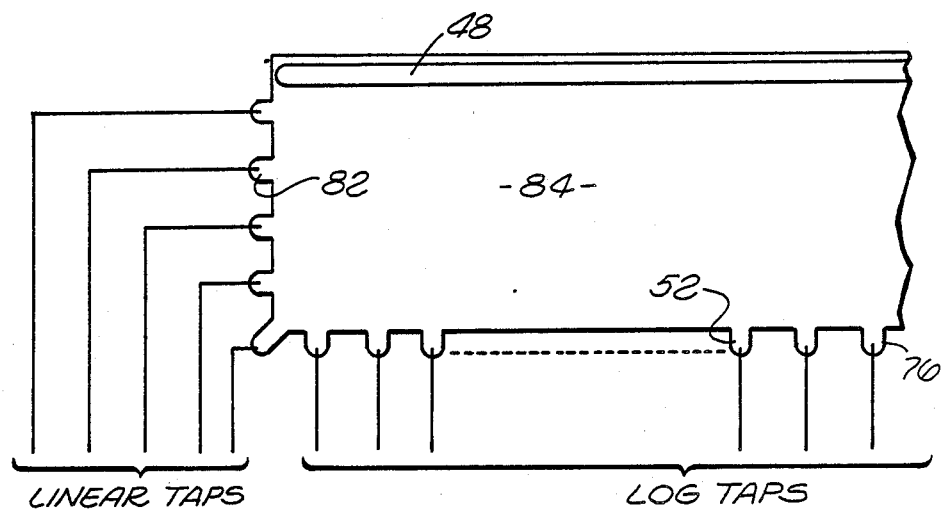

The embodiment shown in FIG. 4b provides the same results as the embodiment shown in FIG. 4a but in a somewhat different manner. The embodiment shown in FIG. 4b is substantially the same as the embodiment shown in FIG. 3. However, terminals 82 are equally spaced along the bottom surface of a thin film 84. As a result, a voltage having a logarithmic relationship with respect to the positions of successive terminals 52 along the side edge of the thin film 84 is provided at such successive terminals. However, a voltage having a linear relationship with respect to the positions of the successive terminals 82 along the bottom surface of the thin film is provided at such successive terminals.

Even though a converter constructed in accordance with this invention to have logarithmic characteristics may be affected only slightly by process gradients, there may still be errors in the logarithmic characteristics at successive ones of the terminals such as the terminals 52 in FIG. 3. For example, errors may result from small local defects in the semi-conductor materials, distortions in the characteristics of the thin film 44 as a result of lithographic errors in the placement of the terminals 52 and the influence from the process for manufacturing the terminals 52. As a result, it may be desirable to calibrate the converter at the time of final test of the converter or to perform a calibration every time that the converter is to be operated.

Figure 5:
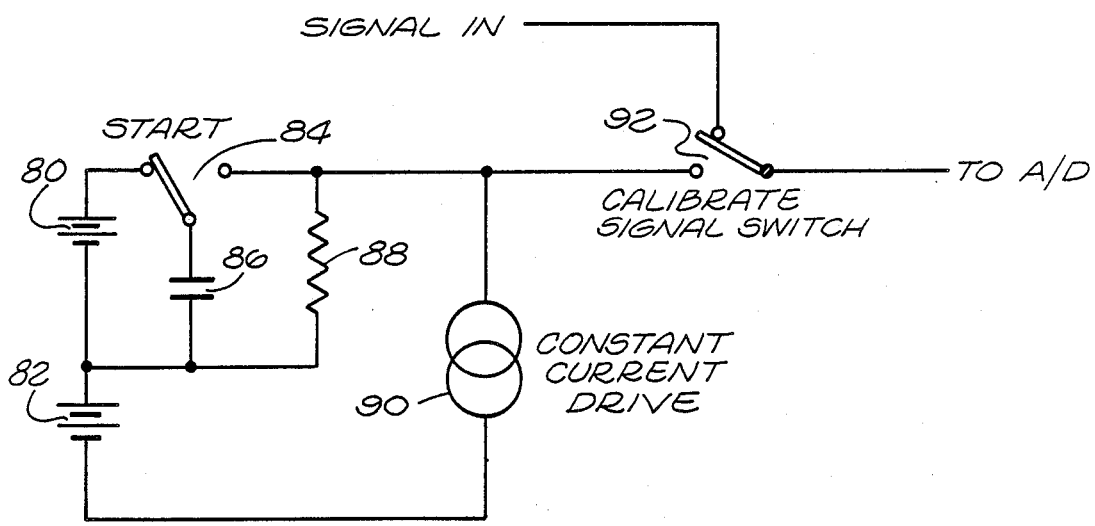
FIG. 5 is a schematic diagram of electrical circuitry for calibrating the converter shown in FIG. 4.

FIG. 5 illustrates a system for calibrating a converter such as shown in FIG. 4. In FIG. 5, a source of direct voltage such as batteries 80 and 82 are connected in series. The positive terminal of the battery 80 is common with a first stationary terminal of a switch 84. A connection is made from the movable arm of the switch 84 to one terminal of a capacitance 86, the other terminal of which is common with the negative terminal of the battery 80. A resistance 88 is connected between a second stationary terminal of the switch 84 and the negative terminal of the battery 80.

A source 90 of a substantially constant current is connected between the second stationary terminal of the switch 86 and the negative terminal of the battery 82. The voltage on the second stationary terminal of the switch 84 is introduced to one stationary terminal of a switch 92 in FIG. 5. The second stationary terminal of the switch 92 receives an input signal on a line 92. The movable arm of the switch 92 is connected to a line corresponding to the line 56 in FIG. 3.

When the movable arm of the switch 84 engages the left stationary terminal of the switch, the capacitance 86 is charged by the battery 80 to a voltage corresponding to the voltage across the battery 80. When the movable arm of the switch 84 engages the right stationary terminal of the switch 84, the capacitance 86 discharges through the resistance 88. As the capacitance 86 discharges, it produces an exponentially decaying voltage corresponding to the portion 76 of the curve in FIG. 6.

With the movable arm of the switch 92 engaging the lower stationary terminal in FIG. 5, the decaying voltage across the capacitance 86 is introduced to the line corresponding to the line 56 in FIG. 3 for comparison with the voltages on the terminals 70 in FIG. 4. As the voltage across the capacitance 86 decays, it matches the voltage on progressive ones of the terminals 70. An output signal is accordingly produced by the decoder 58 every time that such a matching voltage occurs. This output voltage decreases in progressive incremental steps as indicated at 96 in FIG. 7.

Figure 7:
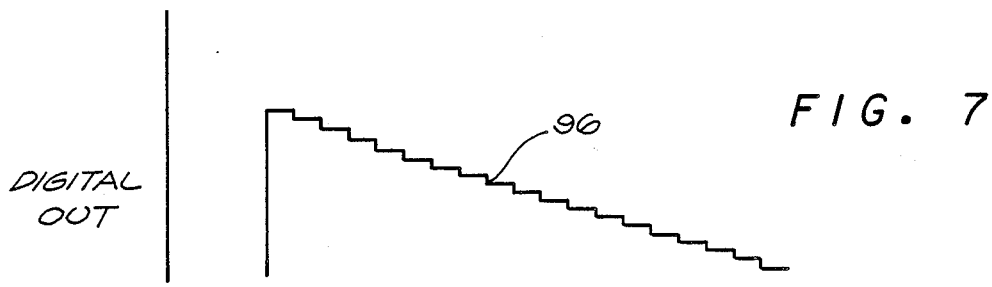
FIG. 7 is a curve showing the relationship between the voltage produced at successive terminals in the converter of FIG. 4 and the time for producing such voltages.

If there are no deviations in the thin film 44 to produce errors in the logarithmic characteristics, every one of the steps in the curve 96 in FIG. 7 will have an equal time increment. However, if the thin film 44 produces errors in the logarithmic characteristic, this will cause deviations to be produced from the equal time increments in FIG. 7. The position of the increment in the curve shown in FIG. 7 will indicate where the errors in the thin film 44 are located. The deviations from equal time increments in the curve shown in FIG. 7 will indicate the extent of each such error. A microprocessor (not shown) can then be programmed to compensate for such errors so that a truly logarithmic relationship can be provided by the converter shown in FIG. 4.

The circuitry shown in FIG. 5 is also operative to calibrate the linear portion 78 of the curve shown in FIG. 6. When the capacitance 86 has discharged to a voltage level corresponding to the voltage level at the juncture between the portions 76 and 78 of the curve shown in FIG. 6, the constant current device 90 in FIG. 5 becomes effective in producing a further discharge of the capacitance. The constant current device may be a field effect transistor or may be any other member well known in the art to provide a constant current when a voltage is applied to it.

As the capacitance 86 discharges through the constant current device 98, the decaying voltage across the capacitance is introduced to a line corresponding to the line 56 in FIG. 3 for comparison with the voltages on the terminals 70 in FIG. 4. An output voltage is accordingly produced by the decoder every time that the voltage from the capacitance 86 matches the voltage on one of the terminals 70. The time for the production of the matching voltages provides a calibration of the voltage on such terminal.

The apparatus constituting this invention has certain important advantages. In one embodiment, it provides voltages with a logarithmic relationship to position from a plurality of evenly spaced terminals. In another embodiment, it provides voltages with such a logarithmic relationship at a first plurality of evenly spaced terminals in a first portion of a member and provides voltages with a linear relationship at a second evenly spaced terminals in a second portion of the member. Preferably the voltages from the first plurality of terminals have relatively high magnitudes and the voltages from the second plurality of terminals have relatively low magnitudes.

The apparatus constituting this invention is formed in a relatively simple manner as by disposing a substantially uniform resistive film on a member and by applying voltages in a particular manner to the member. The outputs from such a member are substantially independent of changes in the resistivity of the thin film at different positions on the member since the changes generally occur progressively in a substantially uniform manner at successive positions on the thin film. The outputs from such a member are also independent of temperature variations.

The apparatus constituting this invention also includes a system for calibrating the voltages produced at the different terminals to represent the logarithmic and linear relationships. In this way, the system is able to determine the deviations at the terminals from the logarithmic and linear relationships. A microprocessor can then be programmed to compensate for such voltage deviations at the different terminals.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed:

1. In combination, a member provided with an electrically resistive material on one surface of the member, the member being defined by first and second side edges and top and bottom edges, means for providing a reference voltage on the resistive material along the first side edge of the member, means for providing an energizing voltage on the resistive material at the juncture between the top edge and the second side edge of the resistive material, and means for obtaining an output voltage at progressive positions along the second side edge of the resistive material the progressive positions at the second side edges of the resistive material being substantially equally spaced to provide a logarithmic relationship in the voltage at the progressive position with respect to the positions of such successive terminals.

2. In a combination as set forth in claim 1,
means for providing an input voltage, and
means for comparing the input voltage with the output voltage at the progressive positions along the second side edge of the resistive material to provide an indication of the input voltage.

3. In a combination as set forth in claim 2,
the reference voltage being an electrical ground and
the energizing voltage being a voltage with a particular magnitude.

4. In combination
a member having a thin resistive film and having a plurality of terminals equally spaced from one another along one edge of the film,
means for applying voltages to the thin film to obtain a logarithmic progression of voltages at successive terminals in the plurality with respect to the positions of such successive terminals, and
means for calibrating the voltages produced at the successive terminals to determine any deviations in such voltages from the logarithmic progression.

5. In combination
a substantially planar member having first and second opposite edges and having top and bottom edges,
an electrically resistive material disposed on the surface of the planar member,
a plurality of terminals at equally spaced positions along one of the side edges of the resistive material, and
means for applying an energizing voltage to the resistive material to obtain voltages in a magnitude having a logarithmic relationship at the successive terminals along the side edge of the resistive material with respect to the positions of such successive terminals.

6. In a combination as set forth in claim 5,
the resistive material constituting a thin substantially uniform layer of an electrical resistance material on the member.

7. In a combination as set forth in claim 6,
a plurality of comparators having first and second input terminals,
means for applying an input signal to the first input terminal of each of the comparators,
means for applying the voltage from each terminal on the resistive material to the second input terminal of an individual one of the comparators, and
means for determining the input voltage from the outputs of the comparators.

8. In a combination as set forth in claim 7,
the voltage means applying the energizing voltage to the resistive material at a particular position relative to the terminals on the side edge of the resistive material.

9. In a combination as set forth in claim 8,
means for applying a ground voltage to the side edge of the resistive material opposite the side edge with the terminals, and
the energizing voltage being applied to the corner of the resistive material adjacent the side edge of the resistive element with the terminals.

10. In a combination as set forth in claim 5,
means for applying a reference voltage to the side edge of the resistive material opposite the side with the terminals.

11. In combination
a member having an electrically resistive material on a defined big surface first and second opposite side edges and top and bottom edges,
a plurality of terminals disposed at the first side edge of the electrically resistive material in equally spaced relationship to one another,
means associated with the electrically resistive material for producing, at first successive terminals in the plurality, voltages having a logarithmic relationship with respect to the positions of such successive terminal, and
means associated with the electrically resistive material for producing, at second successive terminals in the plurality, voltages having a linear relationship with respect to the positions of such second successive terminals,
the second successive terminals on the member being displaced from the first successive terminals on the electrically resistive material.

12. In a combination as set forth in claim 11,
means for applying a reference voltage to the second side edge of the electrically resistive surface at positions opposite the first successive terminals, and
the second successive terminals being displaced from the first successive terminals and the reference voltage means.

13. In a combination as set forth in claim 12,
means for applying the reference voltage to the particular one of the top and bottom edges of the electrically resistive, material close to the second successive terminals.

14. In a combination as set forth in claim 13,
the electrically resistive material on the member being in the form of a thin film having substantially constant characteristics at different positions across said material.

15. In a combination as set forth in claim 12,
the reference voltage means extending along the length of the second side edge of the electrically resistive material, and
the second successive terminals being disposed at a particular one of the top and bottom edges of the electrically resistive material.

16. In a combination as set forth in claim 13,
means for applying an energizing voltage to the electrically resistive material at the juncture between the first side edge of the resistive material and the other one of the top and bottom edges.

17. In combination
a planar member defined by first and second side edges and top and bottom edges,
a thin film of an electrically resistive material disposed substantially uniformly on the member,
a plurality of terminals disposed on the member at the first side edge of the member in equally spaced relationship to one another and in electrical communication with the thin film of the electrically resistive material, and
means for applying a voltage difference to the thin film of the electrically resistive material in a relationship to produce on the successive terminals voltages having a logarithmic relationship with respect to the positions of such successive terminals.

18. In a combination as set forth in claim 17,
means associated with the successive terminals for calibrating the voltages produced on such terminals by the voltage difference applied to the thin film of the electrically conductive material.

19. In a combination as set forth in claim 17,
the voltage difference means applying the voltage difference between one of the side edges of the thin film and the juncture of the other side edge of the thin film with one of the top and bottom edges of the thin film.

20. In a combination as set forth in claim 19,
the second side edge of the thin film receiving a reference voltage, and
means for applying an energizing voltage to the thin film at the juncture between the first side edge of the thin film and the top edge of the thin film.

21. In a combination as set forth in claim 17,
means for providing an input voltage, and
a plurality of comparators each connected to the input voltage means and to an individual one of the successive terminals to co-operate with the other comparators in providing an indication of the value of the input voltage.

22. In combination
a planar member defined by first and second side edges and top and bottom edges,
a thin film of an electrically resistive material disposed substantially uniformly on the member,
a first plurality of terminals disposed on the thin film at the first side edge of the member in equally spaced relationship to one another and in electrical communication with the thin film of the electrically resistive material,
means for applying a voltage between the first and second side edge of the thin film to obtain a logarithmic relationship of the voltages at the first successive terminals with respect to the positions of such first successive terminals, and
second successive terminals disposed on the thin film relative to the first successive terminals film to obtain a linear relationship of the voltages at the second successive terminals with respect to the positions of the such second successive terminals.

23. In a combination as set forth in claim 22,
the first successive terminals on the thin film providing higher voltages than the second successive terminals on the thin film.

24. In a combination as set forth in claim 23,
the second side edge of the thin film being grounded in the first portion of the thin film and a particular one of the top and bottom edges of the thin film closest to the second successive terminals being grounded and the first and second successive terminals being disposed at progressive positions on the first side edge of the thin film.

25. In a combination as set forth in claim 24,
means for applying an energizing voltage to the thin film at the juncture between the first side edge of the thin film and the particular one of the top and bottom edges of the thin film closest to the first successive terminals.

26. In a combination as set forth in claim 25,
the second side edge of the thin film being grounded along the second side edge and the second successive terminals being disposed at progressive positions along the other one of the top and bottom edges.

27. In a combination as set forth in claim 23,
means for providing an input voltage, and a plurality of comparators each responsive to the input voltage and to the voltage at an individual one of the terminals in the plurality for cooperating with the other comparators in providing an indication of the magnitude of the input voltage.

28. In a combination as set forth in claim 27,
the calibrating means including
a capacitance,
means for charging the capacitance,
means for providing a discharge of the capacitance, and
a plurality of comparators each responsive to the voltage on an individual one of the terminals and the voltage from the capacitance to provide a determination of any deviations from the logarithmic progression of the voltages at the successive terminals with respect to the positions of such successive terminals.

29. In a combination as set forth in claim 28,
switching means having first and second states of operation,
the capacitance-charging means being operative to charge the capacitance in the first state of operation of the switching means,
the capacitance-discharging means being operative to discharge the capacitance in the second state of operation of the switching means.

30. In a combination as set forth in claim 29,
the terminals being equally spaced along one edge of the thin film,
the opposite edge of the thin film receiving a reference voltage, and
means for applying an energizing voltage to a juncture on the thin film between the one edge of the thin film and a third edge extending between the first and second edges of the thin film.

31. In combination
a member having first and second oppositely disposed side edges and having top and bottom edges, the member having a substantially uniformly thin resistive film on one surface of the thin film and having a plurality of electrical terminals equally spaced from one another along the first side edge of the film,
means for applying voltages between the first and second side edges of the thin film along the thin film between the top and bottom edges of the thin film to obtain a logarithmic relationship of the voltages at successive terminals in such thin film with respect to the positions of such successive terminals,
means for calibrating the voltages on the thin film at the successive terminals in the plurality to determine any deviations from the logarithmic relationship,
the other terminals being disposed on the thin film to obtain a linear relationship of the voltages at such other terminals with respect to the positions of such other terminals, and
means for calibrating the voltages on the other terminals on the thin film to determine any deviations from the linear relationship of the voltages on such terminals with respect to the positions of such terminals.

32. In a combination as set forth in claim 31,
the calibrating means for the logarithmic relationship including a capacitance and means for providing a charge in the capacitance at first particular times and means for providing a discharge of the capacitance at second particular times different from the first particular times and means for comparing the voltage across the capacitance with the voltages on the successive terminals on the thin film at the second particular times to calibrate the voltages on the successive terminals on the thin film.

33. In a combination as set forth in claim 32,
the calibrating means for the linear relationship including the calibrating means for the logarithmic relationship and further including a source of substantially constant current.

34. In a combination as set forth in claim 33
the other terminals being disposed on the first side edge of the thin film at positions displaced along the first side edge from the successive terminals on the thin film.

35. In a combination as set forth in claim 33,
the other terminals being disposed at progressive positions along a particular one of the top and bottom edges of the thin film.

* * * * *